United States Patent
Horii et al.

(10) Patent No.: US 11,648,585 B2
(45) Date of Patent: May 16, 2023

(54) VIBRATION UNIT

(71) Applicant: TDK CORPORATION, Tokyo (JP)

(72) Inventors: Takuto Horii, Tokyo (JP); Atsushi Ezawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 555 days.

(21) Appl. No.: 16/648,592

(22) PCT Filed: Sep. 13, 2018

(86) PCT No.: PCT/JP2018/034041
§ 371 (c)(1),
(2) Date: Mar. 18, 2020

(87) PCT Pub. No.: WO2019/059100
PCT Pub. Date: Mar. 28, 2019

(65) Prior Publication Data
US 2020/0215573 A1    Jul. 9, 2020

(30) Foreign Application Priority Data

Sep. 25, 2017 (JP) ............................. JP2017-183978

(51) Int. Cl.
*H01L 41/04* (2006.01)
*B06B 1/06* (2006.01)
(Continued)

(52) U.S. Cl.
CPC .......... *B06B 1/0253* (2013.01); *B06B 1/0611* (2013.01); *H01L 41/042* (2013.01); *H01L 41/0825* (2013.01); *B06B 2201/40* (2013.01)

(58) Field of Classification Search
CPC . B06B 1/0611; B06B 1/0253; B06B 2201/40; H01L 41/0825; H01L 41/042
See application file for complete search history.

(56) References Cited

U.S. PATENT DOCUMENTS

| 2006/0028095 A1 | 2/2006 | Maruyama et al. |
| 2006/0238069 A1 | 10/2006 | Maruyama et al. |

(Continued)

FOREIGN PATENT DOCUMENTS

| EP | 2 202 619 A1 | 6/2010 |
| EP | 2 202 620 A1 | 6/2010 |

(Continued)

OTHER PUBLICATIONS

Mar. 31, 2020 International Preliminary Report on Patentability issued in International Patent Application No. PCT/JP2018/034041.

(Continued)

*Primary Examiner* — J. San Martin
(74) *Attorney, Agent, or Firm* — Oliff PLC (57) ABSTRACT

In a vibration unit, a first electrode of a sensor circuit of a control unit is electrically connected to a first external electrode of a first piezoelectric element, a second electrode of the sensor circuit is electrically connected to a second external electrode of the first piezoelectric element, a first electrode of a drive circuit is electrically connected to a first external electrode of a second piezoelectric element, and a second electrode of the drive circuit is electrically connected to a second external electrode of the second piezoelectric element. Only a relatively small voltage induced by an electromotive force occurring due to the flexure of the first piezoelectric element is applied to the sensor circuit. In addition, only a relatively large drive voltage to be applied to the second piezoelectric element is applied to the drive circuit.

4 Claims, 8 Drawing Sheets

(51) Int. Cl.
*B06B 1/02* (2006.01)
*H01L 41/08* (2006.01)

(56) References Cited

U.S. PATENT DOCUMENTS

| | | |
|---|---|---|
| 2007/0080608 A1 | 4/2007 | Maruyama et al. |
| 2007/0096594 A1 | 5/2007 | Maruyama et al. |
| 2015/0091414 A1 | 4/2015 | Lonnberg et al. |
| 2016/0049574 A1* | 2/2016 | Iwazaki ................. H01L 41/09 310/317 |

FOREIGN PATENT DOCUMENTS

| | | |
|---|---|---|
| EP | 2 202 621 A1 | 6/2010 |
| EP | 2 207 080 A1 | 7/2010 |
| EP | 3 018 825 A1 | 5/2016 |
| JP | H02-137975 U | 11/1990 |
| JP | 2002-031574 A | 1/2002 |
| JP | 2004-113391 A | 4/2004 |
| JP | 2005-339298 A | 12/2005 |
| JP | 2006-048302 A | 2/2006 |
| JP | 2006-078429 A | 3/2006 |
| JP | 2010-152889 A | 7/2010 |
| JP | 2011-175364 A | 9/2011 |
| JP | 2015-527724 A | 9/2015 |

OTHER PUBLICATIONS

Oct. 9, 2018 International Search Report issued in International Patent Application No. PCT/JP2018/034041.

\* cited by examiner

VIBRATION UNIT

CROSS-REFERENCE TO RELATED APPLICATIONS

This application is a 35 U.S.C. § 371 national phase application of PCT/JP2018/0034041, filed on Sep. 13, 2018, which claims priority to Japanese Patent Application No. 2017-183978, filed on Sep. 25, 2017.

TECHNICAL FIELD

The present disclosure relates to a vibration unit.

BACKGROUND ART

In the related art, there is known a technique of repeatedly expanding and contracting a piezoelectric element to convert the expansion and contraction thereof into vibrations. Patent Literature 1 referred below discloses a vibration unit that detects a pressure occurring when an overlay is pressed down with the finger and includes a piezoelectric element having a sheet shape which generates sensible vibrations in the overlay.

CITATION LIST

Patent Literature

Patent Literature 1: Japanese Unexamined Patent Publication No. 2015-527724
Patent Literature 2: Specification of European Examined Patent Publication No. 3018825

SUMMARY OF INVENTION

Technical Problem

In order to realize the foregoing function, the foregoing vibration unit in the related art requires a sensor circuit that detects an electromotive force occurring due to the flexure of the piezoelectric element, and a drive circuit that applies a predetermined drive voltage to the piezoelectric element.

Figure 8:
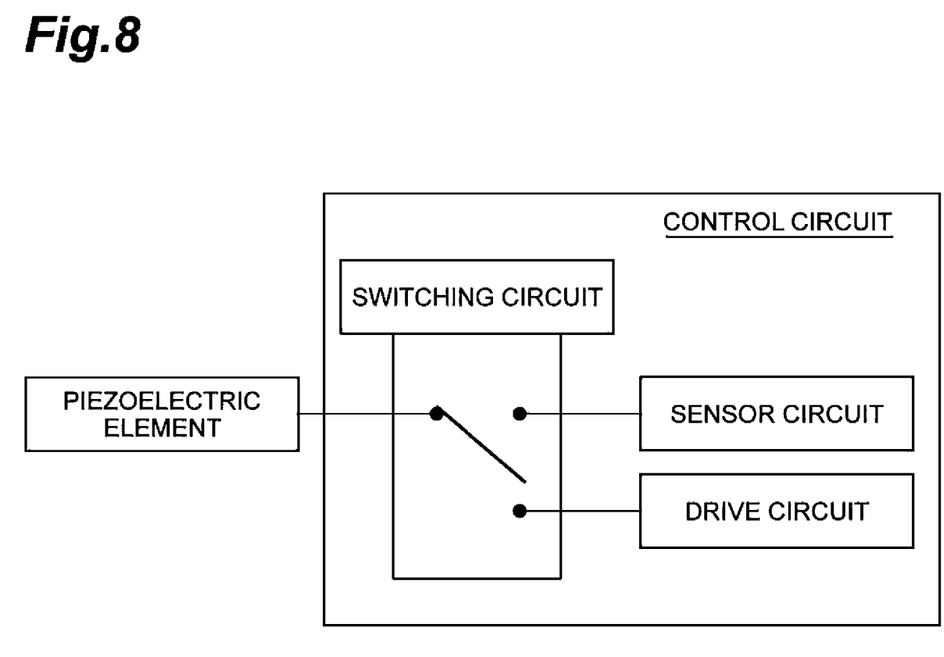
FIG. 8 is a view illustrating a circuit configuration of a vibration unit in the related art.

However, since the voltage value (for example, several tens to several hundreds of volts) of the drive voltage applied by the drive circuit is larger than the voltage value (for example, several volts) of the electromotive force detected by the sensor circuit, it is necessary to avoid an incident such as a high voltage current of the drive circuit flowing into the sensor circuit. For this reason, as illustrated in FIG. 8, it is necessary to separately provide a switching circuit that switches between the sensor circuit and the drive circuit, or separately provide other protective circuits. In this case, that can be one of causes to complicate a control circuit that controls the vibration unit.

An object of the present disclosure is to provide a vibration unit of which a control circuit is simplified.

Solution to Problem

According to one aspect of the present disclosure, there is provided a vibration unit including a vibration device including a first piezoelectric element having a sheet shape, a second piezoelectric element having a sheet shape and extending parallel to the first piezoelectric element, and a vibration plate including one main surface on which the first piezoelectric element is arranged and the other main surface on which the second piezoelectric element is arranged, and a control unit including a sensor circuit that detects an electromotive force occurring in the first piezoelectric element, and a drive circuit that applies a drive voltage to the second piezoelectric element when the electromotive force is detected by the sensor circuit. Each of the first piezoelectric element and the second piezoelectric element has a configuration where a piezoelectric body is interposed between a first external electrode and a second external electrode in a thickness direction of the vibration plate. A first electrode of the sensor circuit is electrically connected to the first external electrode of the first piezoelectric element, and a second electrode of the sensor circuit is electrically connected to the second external electrode of the first piezoelectric element. A first electrode of the drive circuit is electrically connected to the first external electrode of the second piezoelectric element, and a second electrode of the drive circuit is electrically connected to the second external electrode of the second piezoelectric element.

In the vibration unit, only a relatively small voltage induced by an electromotive force occurring due to the flexure of the first piezoelectric element is applied to the sensor circuit, and only a relatively large drive voltage to be applied to the second piezoelectric element is applied to the drive circuit. For this reason, it is not necessary to separately provide a switching circuit and the like in the control unit that controls the vibration unit, and the control unit can be formed of a simple control circuit.

In the vibration unit according to another aspect, the vibration plate is made of a material having conductivity, the second external electrode of the first piezoelectric element and the second external electrode of the second piezoelectric element which are positioned on a vibration plate side are electrically connected to the vibration plate, and the second electrode of the sensor circuit and the second electrode of the drive circuit are connected to the vibration plate. In this case, the degree of freedom in designing a location for the connection of the second electrode of the sensor circuit and the second electrode of the drive circuit is improved.

The vibration unit according to another aspect further includes a first case portion having a plate shape and extending parallel to the vibration plate, and a second case portion having a plate shape and extending parallel to the first case portion. The vibration device is arranged on a second case portion side of the first case portion, and is supported on the second case portion, and the first external electrode of the first piezoelectric element is in contact with a main surface on the second case portion side of the first case portion. In this case, when contact with the first case portion is detected with the first piezoelectric element and the sensor circuit, the drive circuit can generate vibrations in the vibration plate by causing the second piezoelectric element to expand and contract.

In the vibration unit according to another aspect, an external shape of the second piezoelectric element is larger than an external shape of the first piezoelectric element as seen from the thickness direction of the vibration plate. In this case, the amount of expansion and contraction of the second piezoelectric element when a drive voltage is applied thereto by the drive circuit is larger than when the external shape of the second piezoelectric element is the same as the external shape of the first piezoelectric element; and thereby, it is possible to further increase the amplitude of the vibration of the vibration plate induced by the expansion and contraction of the second piezoelectric element.

Advantageous Effects of Invention

According to the present disclosure, there is provided the vibration unit of which the control circuit is simplified.

DESCRIPTION OF EMBODIMENTS

Hereinafter, an embodiment of the present disclosure will be described in detail with reference to the accompanying drawings. Incidentally, the same reference signs are assigned to the same or equivalent elements, and when descriptions are repeated, the descriptions will be omitted.

Figure 1:
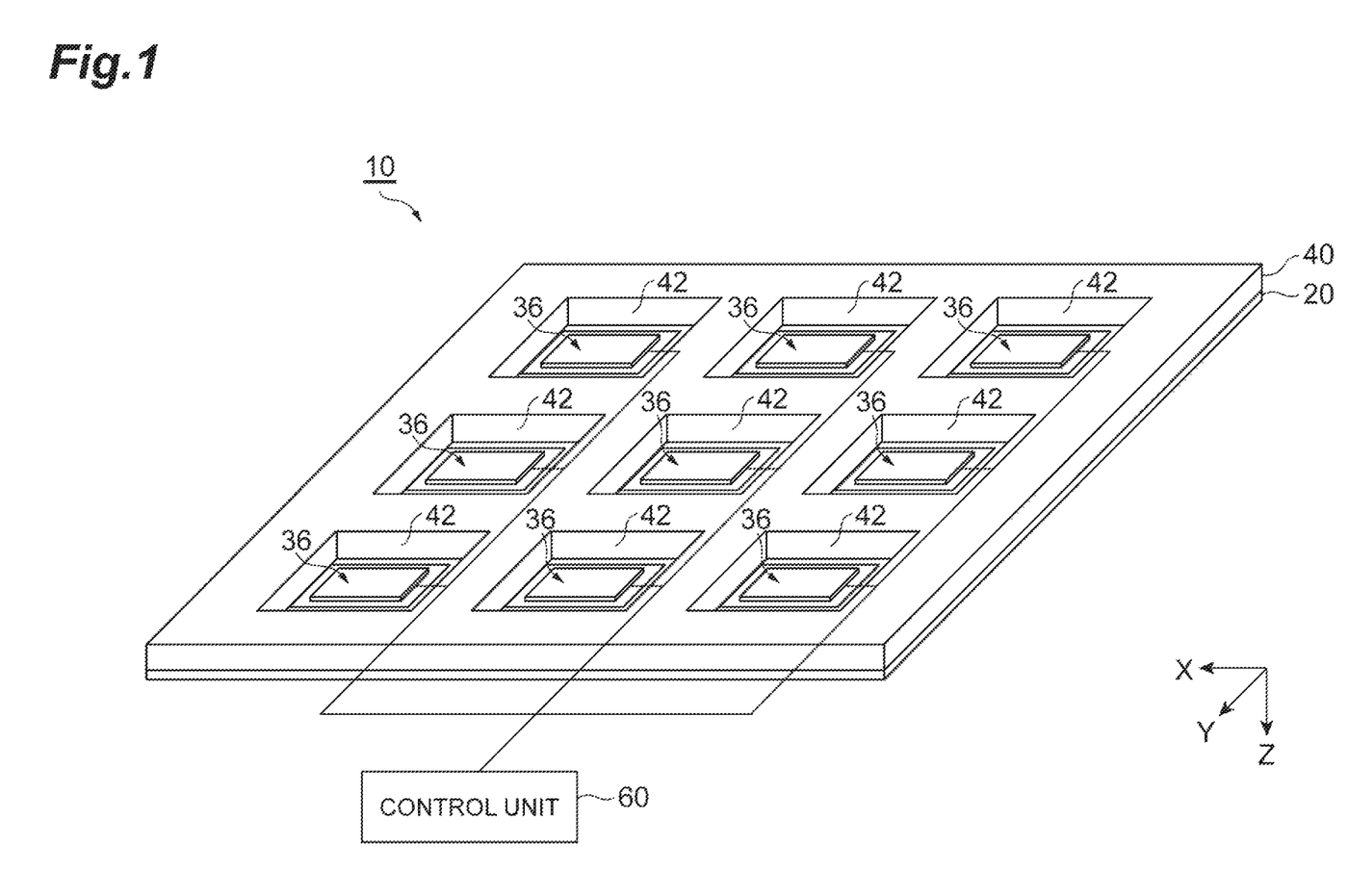
FIG. 1 is a schematic perspective view illustrating a back surface of a vibration unit according to an embodiment.
Figure 2:
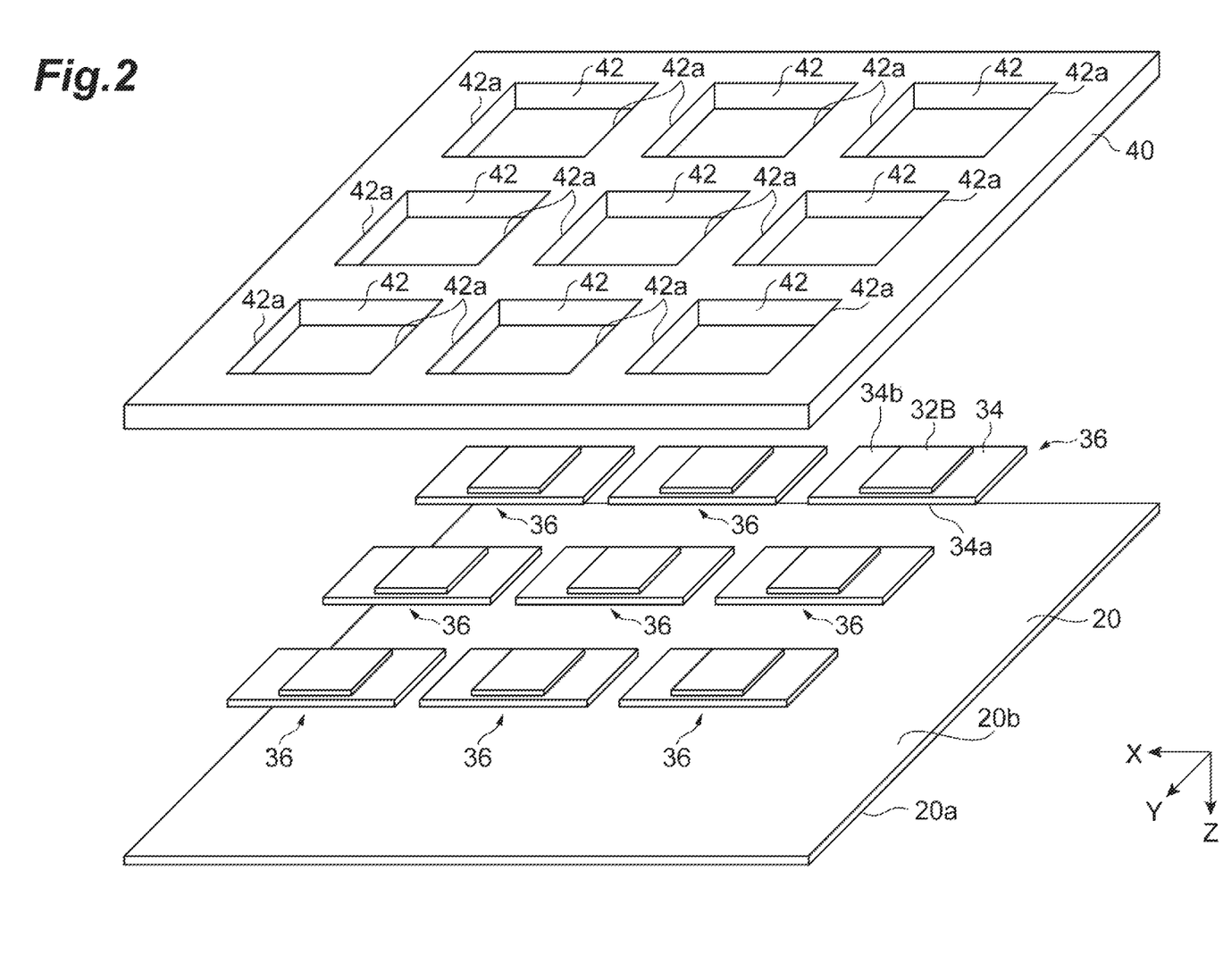
FIG. 2 is an exploded perspective view of the vibration unit illustrated in FIG. 1.
Figure 3:
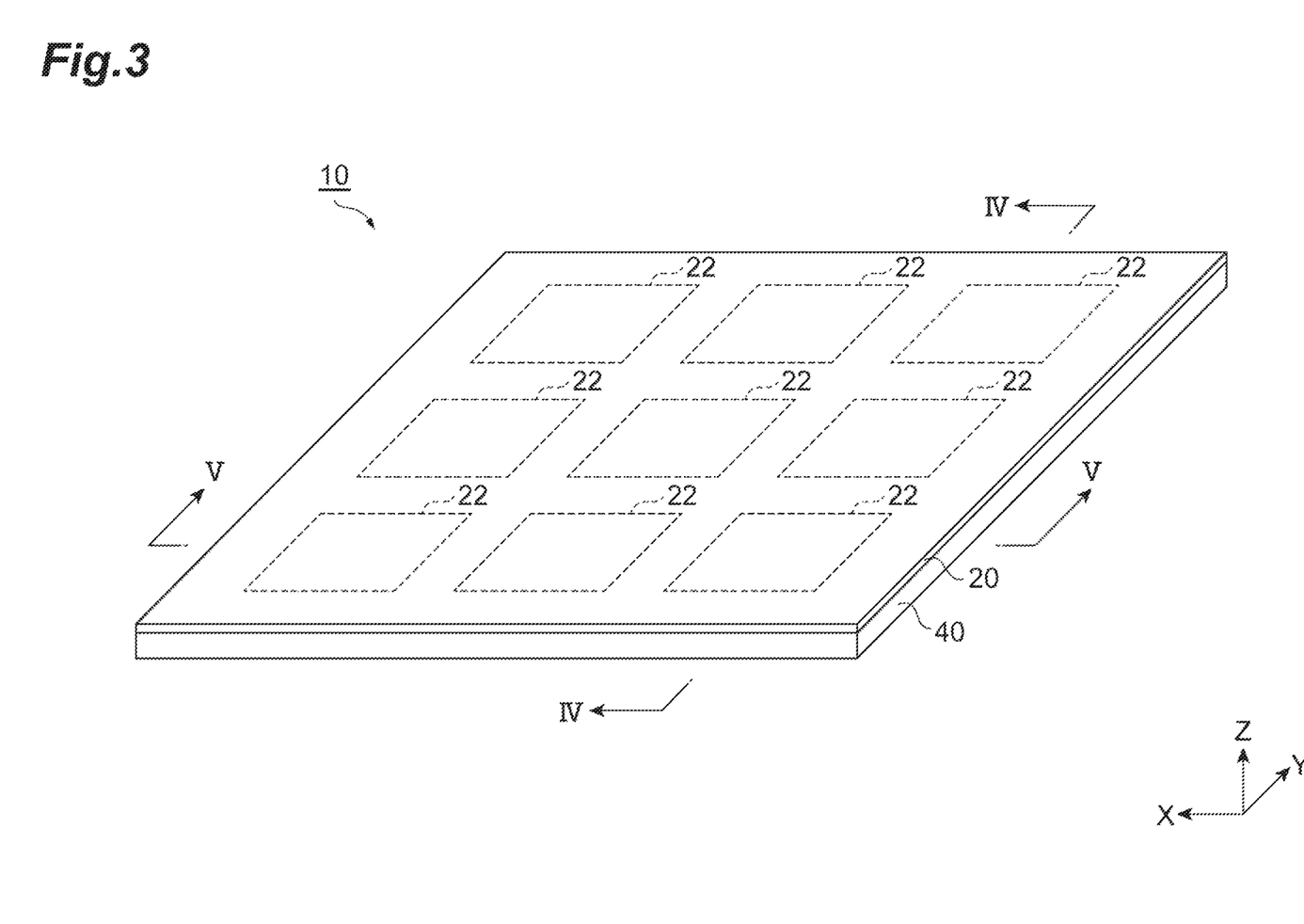
FIG. 3 is a schematic perspective view illustrating a front surface of the vibration unit illustrated in FIG. 1.

Firstly, the entire configuration of a vibration unit 10 according to the embodiment will be described with reference to FIGS. 1 to 3.

The vibration unit 10 includes a first case member (first case portion) 20 having a plate shape. The first case member 20 is configured such that one main surface 20a can be contacted by, for example, the finger of the human. As illustrated in FIG. 3, a plurality of contact regions 22 are provided in one main surface 20a of the first case member 20. In this embodiment, nine contact regions 22 with a square shape are arranged in a matrix pattern in the main surface 20a of the first case member 20. The first case member 20 has such a relatively low modulus of elasticity that when there is contact with the contact region 22, the first case member 20 is sufficiently deformed in a flexural manner. The first case member 20 can be made of a resin material such as polycarbonate.

Hereinafter, for convenience of description, one of arrangement directions of the contact regions 22 of the main surface 20a of the first case member 20 is referred to as an X direction and the other is referred to as a Y direction. The thickness direction of the first case member 20 is referred to as a Z direction.

The vibration unit 10 includes a second case member (second case portion) 40 having a plate shape. The second case member 40 extends parallel to the first case member 20 in a state where the second case member 40 is spaced a predetermined distance apart from the first case member 20. In the second case member 40, a region corresponding to each of the contact regions 22 of the first case member 20 is open, and the open part is a through hole 42. Namely, similar to the contact region 22, the through hole 42 has a square shape as seen from the Z direction. The second case member 40 can be made of a resin material such as acryl.

Figure 4:
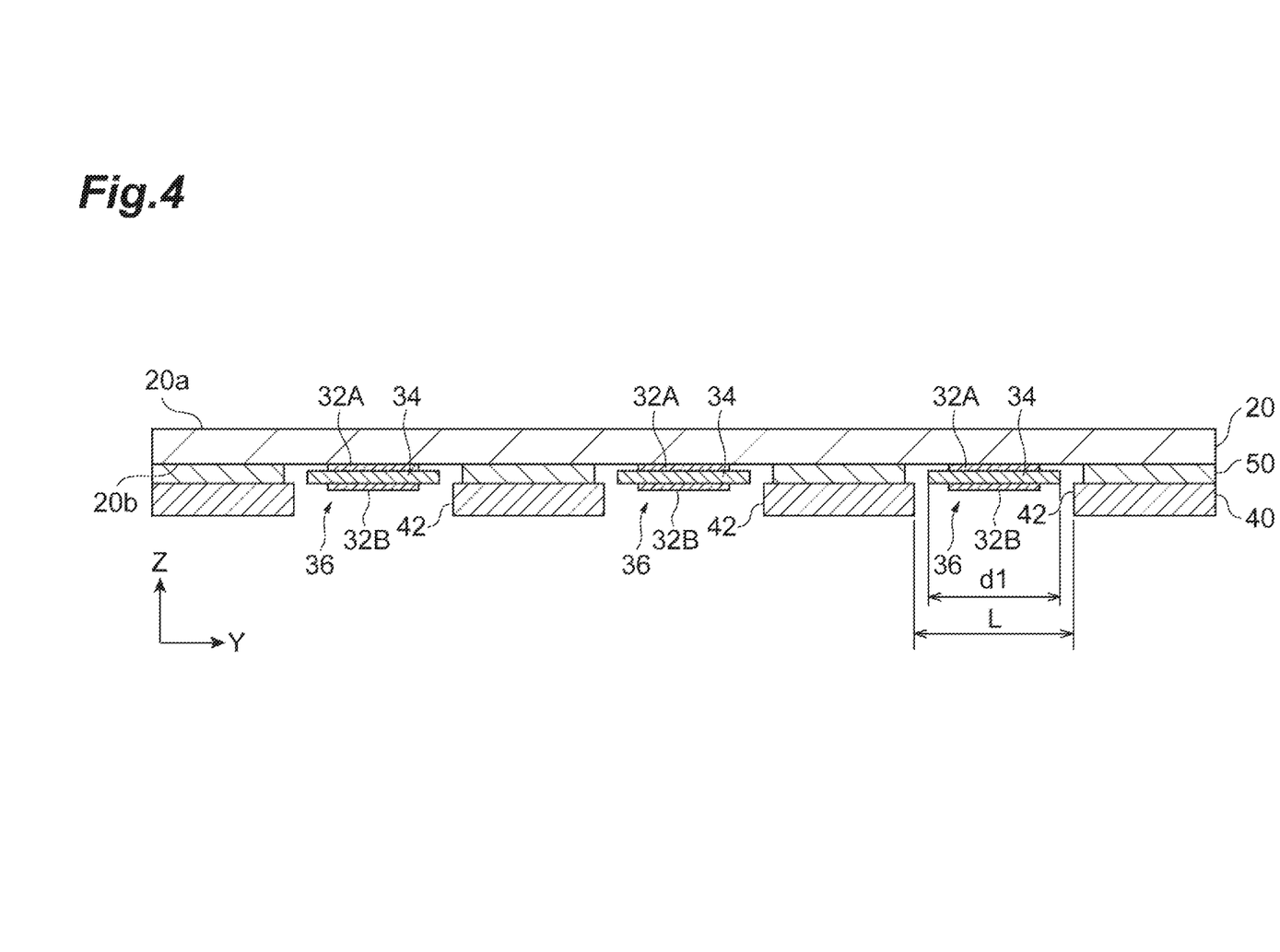
FIG. 4 is a cross-sectional view of the vibration unit taken along line IV-IV in FIG. 3.
Figure 5:
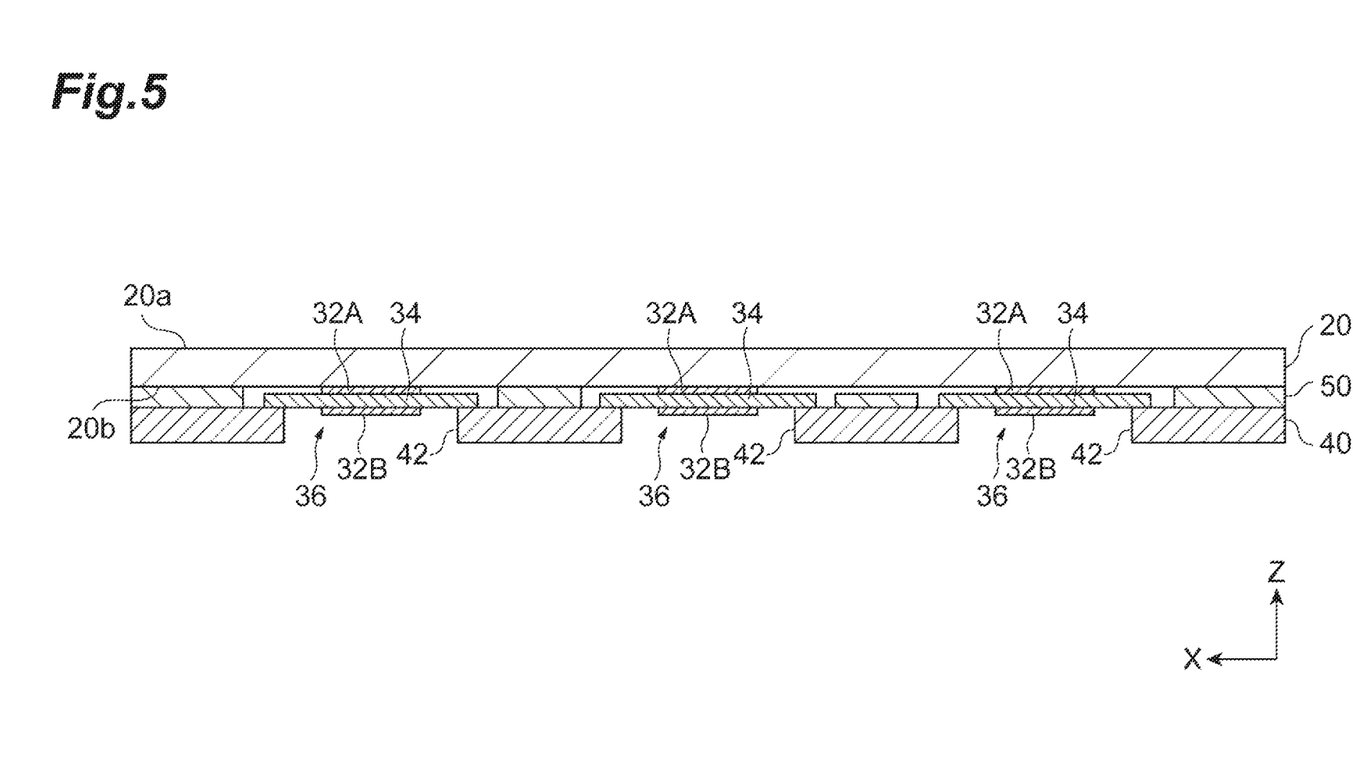
FIG. 5 is a cross-sectional view of the vibration unit taken along line V-V in FIG. 3.

As illustrated in FIGS. 4 and 5, a plurality of vibration devices 36 are arranged on the other main surface 20b of the first case member 20 between the first case member 20 and the second case member 40. In this embodiment, nine vibration devices 36 are arranged at positions corresponding to the positions of the contact regions 22 and the through holes 42 described above. Each of the vibration devices 36 includes a pair of piezoelectric elements 32A and 32B and a vibration plate 34.

The vibration plate 34 is a plate-shaped member with a rectangular shape having long sides and short sides. The vibration plate 34 is made of a material having conductivity, and can be made of, for example, a nickel alloy or stainless steel. The vibration plate 34 can be configured with a single layer or a plurality of layers. As illustrated in FIG. 2, a plurality of the vibration plates 34 are arranged such that long side directions of all of the vibration plates 34 are the same directions, namely, are aligned with the X direction. Each of the vibration plates 34 is designed such that as illustrated in FIG. 4, a short side length d1 of the vibration plate 34 is shorter than a length L of one side of the square shape of the through hole 42 and as illustrated in FIG. 5, a long side length d2 of the vibration plate 34 is longer than the length L of one side of the square shape of the through hole 42. In each of the vibration plates 34, only both short side parts of the vibration plate 34 face an edge 42a of the through hole 42.

Both of the pair of piezoelectric elements 32A and 32B have a sheet shape, and are arranged to interpose the vibration plate 34 therebetween. Specifically, one piezoelectric element (hereinafter, also referred to as a first piezoelectric element) 32A is arranged on one main surface 34a of the vibration plate 34, and the other piezoelectric element (hereinafter, also referred to as a second piezoelectric element) 32B is arranged on the other main surface 34b of the vibration plate 34. Both of the pair of piezoelectric elements 32A and 32B are arranged at the center position of the vibration plate 34, namely, at middle positions in the long side direction and a short side direction of the vibration plate 34.

Figure 6:
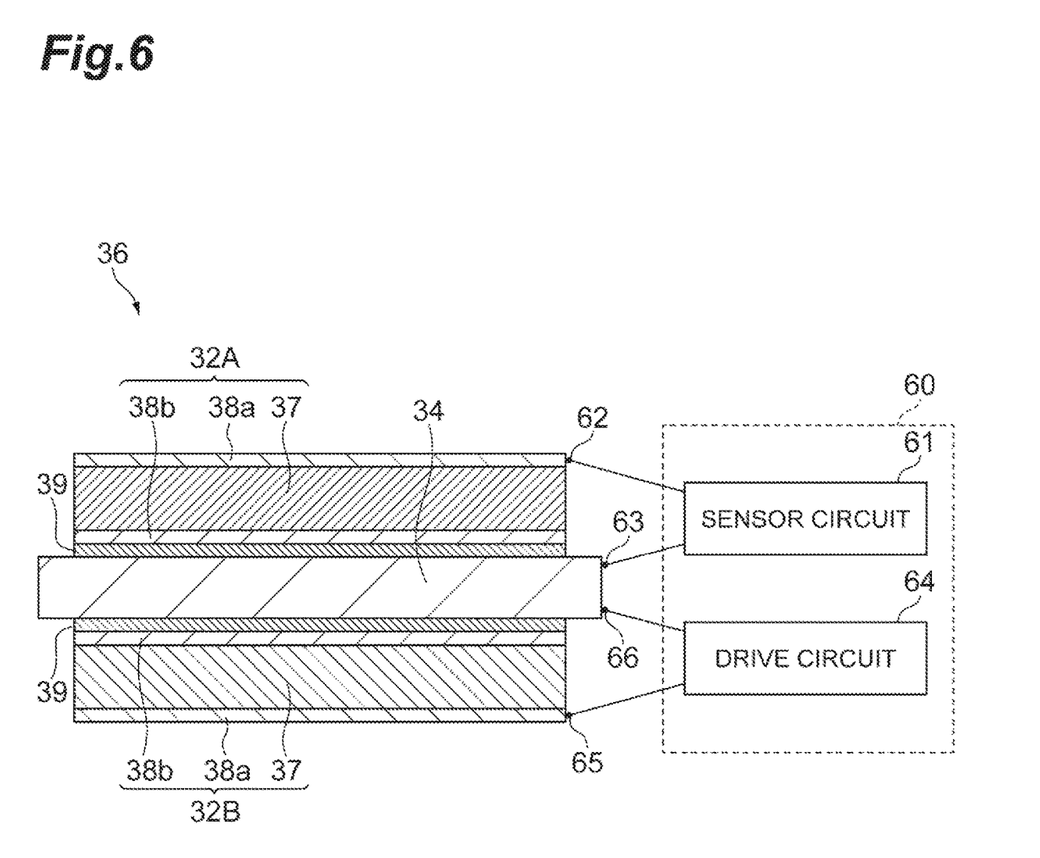
FIG. 6 is a view illustrating a specific configuration of a vibration device and electrical connection between the vibration device and a control unit.

As illustrated in FIG. 6, each of the piezoelectric elements 32A and 32B has a configuration where a piezoelectric body 37 having a plate shape is interposed between a first external electrode 38a and a second external electrode 38b in the thickness direction (Z direction) of the vibration plate 34. The piezoelectric body 37 can have a single layer structure with a piezoelectric body layer, and can have also a multi-layer structure where piezoelectric body layers and internal electrode layers are alternately stacked in the Z direction. Each of the second external electrodes 38b of the piezoelectric elements 32A and 32B is positioned on a vibration plate 34 side, and is electrically and physically connected to the vibration plate 34 via a conductive layer 39. The entire surface of the first external electrode 38a of the first piezoelectric element 32A is in direct contact with the main surface 20b on a second case member side of the first case member 20.

The first piezoelectric element 32A is electrically connected to a sensor circuit 61 that is included in a control unit 60. Specifically, a first electrode 62 of the sensor circuit 61 is electrically connected to the first external electrode 38a of the first piezoelectric element 32A, and a second electrode 63 of the sensor circuit 61 is connected to the vibration plate 34 and is electrically connected to the second external electrode 38b of the first piezoelectric element 32A via the vibration plate 34. In the first piezoelectric element 32A, a potential difference occurs between a pair of the external electrodes 38*a* and 38*b* due to an electromotive force induced when a displacement such as bending occurs in the piezoelectric body 37. The sensor circuit 61 of the control unit 60 is configured to be able to detect the potential difference that occurs between the external electrodes 38*a* and 38*b* due to the foregoing electromotive force of the first piezoelectric element 32A.

The second piezoelectric element 32B is electrically connected to a drive circuit 64 that is included in the control unit 60. Specifically, a first electrode 65 of the drive circuit 64 is electrically connected to the first external electrode 38*a* of the second piezoelectric element 32B, and a second electrode 66 of the drive circuit 64 is connected to the vibration plate 34 and is electrically connected to the second external electrode 38*b* of the second piezoelectric element 32B via the vibration plate 34.

The second piezoelectric element 32B expands and contracts in an in-plane direction (direction parallel to an X-Y plane) when a predetermined voltage is applied between the pair of external electrodes 38*a* and 38*b*. The drive circuit 64 of the control unit 60 is configured to be able to cause the second piezoelectric element 32B to expand and contract by applying a drive voltage between the external electrodes 38*a* and 38*b* of the second piezoelectric element 32B when the foregoing electromotive force is detected by the sensor circuit 61. When the second piezoelectric element 32B expands and contracts in the direction parallel to the X-Y plane, the vibration plate 34 bonded to the second piezoelectric element 32B bends in the Z direction. In this embodiment, since the vibration plate 34 has a rectangular shape and the long side length d2 is longer than the short side length d1, the vibration plate 34 bends in such a manner that the long side of the vibration plate 34 bends larger than the short side thereof.

When the drive circuit 64 periodically applies a voltage between the external electrodes 38*a* and 38*b* of the second piezoelectric element 32B, the piezoelectric body 37 of the second piezoelectric element 32B expands and contracts repeatedly in the direction parallel to the X-Y plane, and therefore the vibration plate 34 bends repeatedly in the Z direction. As a result, vibrations occur in the vibration device 36 in the Z direction. In this embodiment, since the vibration plate 34 has a rectangular shape and the long side length d2 is longer than the short side length d1, vibrations which produce a large amplitude in the long side direction (X direction) occur.

Incidentally, the control unit 60 can be formed of a circuit including a CPU and various electrical elements.

In addition, the first case member 20 is bonded to the second case member 40 with a bonding portion 50 in a state where the first case member 20 is spaced the predetermined distance apart from the second case member 40. The bonding portion 50 is made of a bonding material such as a double sided tape or an ultraviolet curable adhesive. The bonding portion 50 can be formed, for example, around the through hole 42. The bonding portion 50 is formed apart from the vibration plate 34 such that the vibration of the vibration plate 34 of the vibration device 36 is not restricted.

Subsequently, the operation of the vibration unit 10 described above will be described.

Figure 7:
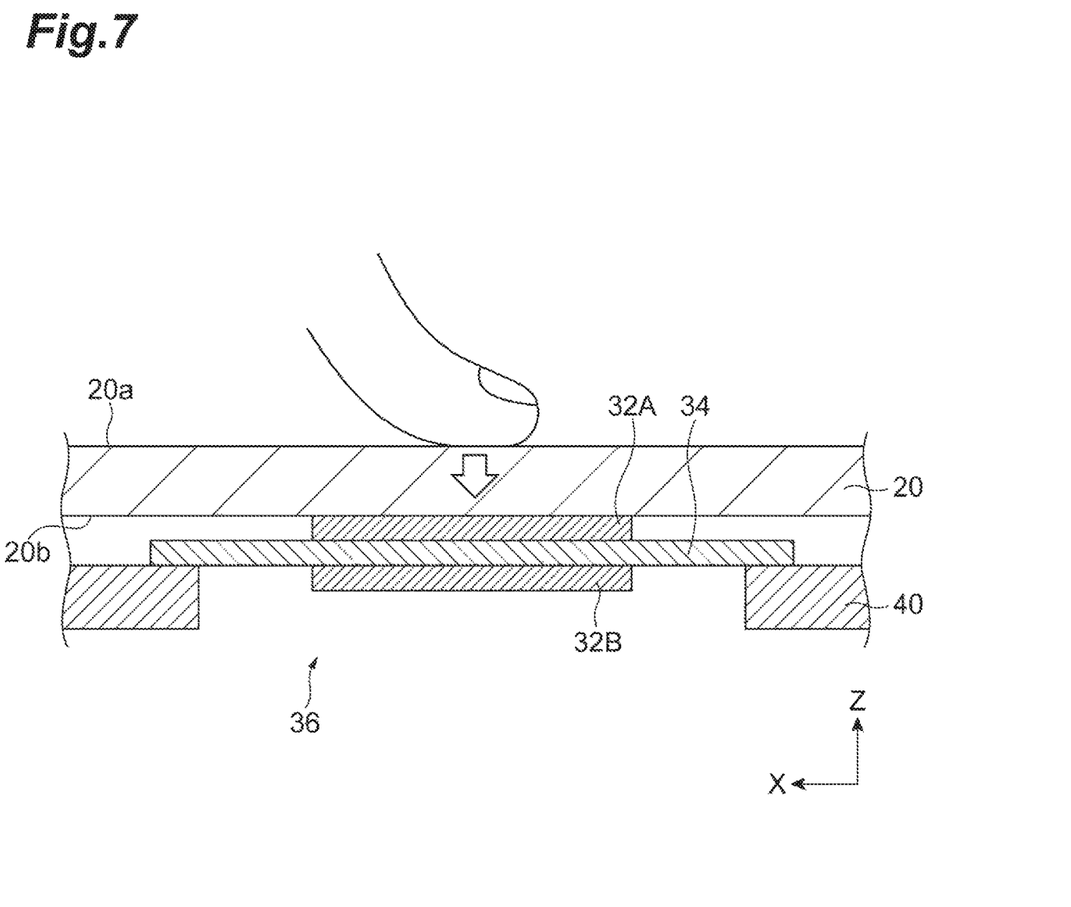
FIG. 7 is an enlarged view of a main part of FIG. 5.

As illustrated in FIG. 7, when any one of the contact regions 22 of the first case member 20 of the vibration unit 10 is flexed toward the second case member 40, for example, by being pressed down with the finger, the first piezoelectric element 32A which is in contact with the main surface 20*b* of the first case member 20 flexes according to the flexure. Therefore, an electromotive force occurs in the piezoelectric body 37 of the first piezoelectric element 32A, so that a potential difference occurs between the pair of external electrodes 38*a* and 38*b*. By detecting the potential difference occurring between the pair of external electrodes 38*a* and 38*b* of the first piezoelectric element 32A, the sensor circuit 61 of the control unit 60 detects contact with the specific contact region 22.

When the sensor circuit 61 detects contact with the contact region 22, the control unit 60 causes the drive circuit 64 to drive the vibration device 36 corresponding to the contact region 22 which is contacted. Specifically, a periodic drive voltage (for example, a drive voltage with a waveform such as a square waveform or a triangular waveform) is applied from the drive circuit 64 to the vibration device 36. Then, as described above, vibrations occur in the vibration plate 34 of the vibration device 36 in the Z direction, and therefore also the contact region 22 of the first case member 20 which corresponds to the vibration device 36 under vibration vibrates in the Z direction. Namely, only the contact region 22 which is flexed vibrates selectively. At the time, vibrations occur in the contact region 22 to such an extent that the vibrations can be sensed with the finger or the like.

Incidentally, the control unit 60 may cause the first piezoelectric element 32A and the sensor circuit 61 to detect the vibration of the vibration plate 34 which occurs when the drive circuit 64 drives the second piezoelectric element 32B. In this case, the control unit 60 can confirm (self-check) whether or not the vibration plate 34 vibrates actually when the drive circuit 64 drives the second piezoelectric element 32B. Due to such self-checking, it is possible to detect a malfunction or an operation failure with the drive circuit 64 and the second piezoelectric element 32B.

The first case member 20 can be designed with a relatively low modulus of elasticity such that the contact region 22 is flexed a sufficient amount and the vibration of the vibration device 36 propagates efficiently. On the other hand, the second case member 40 can be designed with a relatively high modulus of elasticity so as to support the vibration device 36. In this embodiment, the design is done such that the modulus of elasticity of the first case member 20 is lower than the modulus of elasticity of the second case member 40.

As described above, in the vibration unit 10, each of the first piezoelectric element 32A and the second piezoelectric element 32B has the configuration where the piezoelectric body 37 is interposed between the first external electrode 38*a* and the second external electrode 38*b* in the Z direction. The sensor circuit 61 of the control unit 60 includes the first electrode 62 that is electrically connected to the first external electrode 38*a* of the first piezoelectric element 32A, and the second electrode 63 that is electrically connected to the second external electrode 38*b* of the first piezoelectric element 32A via the vibration plate 34. The drive circuit 64 includes the first electrode 65 that is electrically connected to the first external electrode 38*a* of the second piezoelectric element 32B, and the second electrode 66 that is electrically connected to the second external electrode 38*b* of the second piezoelectric element 32B via the vibration plate 34.

Therefore, in the vibration unit 10, only a relatively small voltage induced by an electromotive force occurring due to the flexure of the first piezoelectric element 32A is applied to the sensor circuit 61. In addition, only a relatively large drive voltage to be applied to the second piezoelectric element 32B is applied to the drive circuit 64. For this reason, it is not necessary to separately provide a switching circuit and the like in the control unit 60 that controls the vibration unit 10, and the control unit 60 can be formed of a simple control circuit.

The second electrode 63 of the sensor circuit 61 and the second electrode 66 of the drive circuit 64 may be connected to the second external electrode 38*b* of the first piezoelectric element 32A and the second external electrode 38*b* of the second piezoelectric element 32B. However, as illustrated in FIG. 6, when the exposed area of the second external electrode 38*b* is small, it can be difficult to make connection thereto. In that case, it can be considered that the vibration plate 34 where a relatively large exposure area is securable is used as a location for connection. Namely, since the vibration plate 34 is made of a material having conductivity and the vibration plate 34 is electrically conducted with the second external electrode 38*b*, the vibration plate 34 can be used as a location for connection to the second electrodes 63 and 66, and in this case, the degree of freedom in designing the location for connection is improved.

Figure 9:
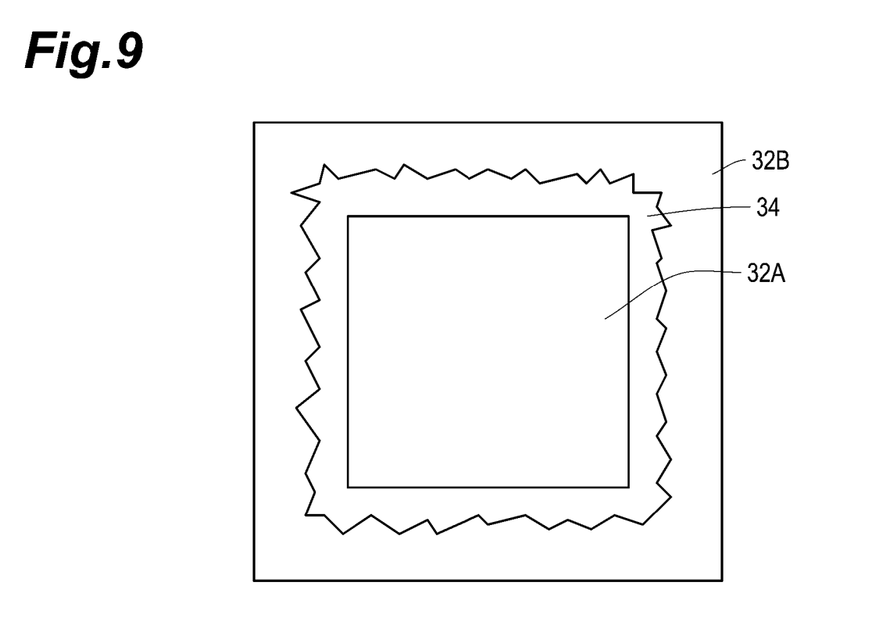
FIG. 9 is a partial top plan view of the vibration device of the vibration unit illustrated in FIGS. 1, 2 and 4-7.

Incidentally, the vibration unit 10 can be designed such that the external shape of the second piezoelectric element 32B is larger than the external shape of the first piezoelectric element 32A as seen from the Z direction, as shown in FIG. 9. In this case, the amount of expansion and contraction of the second piezoelectric element 32B when a drive voltage is applied thereto by the drive circuit 64 is larger than when the external shape of the second piezoelectric element 32B is the same as the external shape of the first piezoelectric element 32A. In this case, it is possible to further increase the amplitude of the vibration of the vibration plate 34 induced by the expansion and contraction of the second piezoelectric element 32B.

One embodiment of the present disclosure has been described above; however, the present disclosure is not limited to the embodiment, and may be modified or applied in other forms without changing the concept described in each claim.

In the foregoing embodiment, an aspect where the first case member and the second case member are separately formed has been described; however, an aspect where the first case member and the second case member are integrally formed may be adopted.

In addition, the through hole provided in the second case member may be a recess portion which is recessed away from the vibration plate as long as a space for allowing the bending of the vibration plate is secured in the recess portion.

REFERENCE SIGNS LIST

10: vibration unit, 20: first case member, 32A: first piezoelectric element, 32B: second piezoelectric element, 37: piezoelectric body, 38*a*: first external electrode, 38*b*: second external electrode, 34: vibration plate, 36: vibration device, 40: second case member, 60: control unit, 61: sensor circuit, 64: drive circuit.

The invention claimed is:

1. A vibration unit comprising:
   a vibration device including a first piezoelectric element having a sheet shape, a second piezoelectric element having a sheet shape and extending parallel to the first piezoelectric element, and a vibration plate including one main surface on which the first piezoelectric element is arranged and the other main surface on which the second piezoelectric element is arranged;
   a control unit including a sensor circuit that detects an electromotive force occurring in the first piezoelectric element, and a drive circuit that applies a drive voltage to the second piezoelectric element when the electromotive force is detected by the sensor circuit;
   a first case portion having a plate shape and extending parallel to the vibration plate; and
   a second case portion having a plate shape and extending parallel to the first case portion, wherein:
   each of the first piezoelectric element and the second piezoelectric element has a configuration where a piezoelectric body is interposed between a first external electrode and a second external electrode in a thickness direction of the vibration plate;
   a first electrode of the sensor circuit is electrically connected to the first external electrode of the first piezoelectric element, and a second electrode of the sensor circuit is electrically connected to the second external electrode of the first piezoelectric element;
   the vibration device is arranged on a second case portion side of the first case portion, and is supported on the second case portion; and
   the first external electrode of the first piezoelectric element is in contact with a main surface on the second case portion side of the first case portion.

2. The vibration unit according to claim 1, wherein the vibration plate is made of a material having conductivity, the second external electrode of the first piezoelectric element and the second external electrode of the second piezoelectric element which are positioned on a vibration plate side are electrically connected to the vibration plate, and the second electrode of the sensor circuit and the second electrode of the drive circuit are connected to the vibration plate.

3. The vibration unit according to claim 1, wherein an external shape of the second piezoelectric element is larger than an external shape of the first piezoelectric element as seen from the thickness direction of the vibration plate.

4. The vibration unit according to claim 2, wherein an external shape of the second piezoelectric element is larger than an external shape of the first piezoelectric element as seen from the thickness direction of the vibration plate.

* * * * *